United States Patent [19]

Minter

[11] 4,061,405
[45] Dec. 6, 1977

[54] APPARATUS FOR HANDLING CONNECTORS

[76] Inventor: Jerry B. Minter, Normandy Heights Road, Morristown, N.J. 07960

[21] Appl. No.: 646,473

[22] Filed: Jan. 5, 1976

Related U.S. Application Data

[62] Division of Ser. No. 504,233, Sept. 9, 1974, Pat. No. 3,940,849.

[51] Int. Cl.$^2$ .......................... H05K 1/07; H05K 3/34
[52] U.S. Cl. ................... 339/17 M; 29/739; 29/758; 29/760; 206/329
[58] Field of Search ................ 29/203 P, 203 J, 628, 29/629, 630; 206/324, 328–486; 339/17, 19, 108, 110, 278 F

[56] References Cited

U.S. PATENT DOCUMENTS

| | | | |
|---|---|---|---|
| 2,122,289 | 6/1938 | Legendre | 206/486 |
| 3,079,957 | 3/1963 | Weiss | 29/630 D |
| 3,140,773 | 7/1964 | Cheh | 206/330 |
| 3,441,853 | 4/1969 | Bodine | 206/331 |

FOREIGN PATENT DOCUMENTS

630,126  10/1961  Canada ........................... 339/17 L

*Primary Examiner*—Roy Lake
*Assistant Examiner*—Neil Abrams
*Attorney, Agent, or Firm*—Donald P. Gillette

[57] ABSTRACT

An array of bent wire connectors to grip the edge of a printed circuit board is held in spaced, opposed grooves on facing side walls of a holder so that the whole array can be affixed to a mother board as a unit by soldering the free ends of the connectors in place. The grooves can be preformed to hold the connectors in the array, or they can be formed in situ by heating a jig with the connectors assembled in a similar array of holes in the surface of the jig and then pressing a thermoplastic holder onto the connectors. The heated connectors soften the contiguous portions of the holder, and after the latter is in place, the assembly is allowed to cool so that the thermoplastic material can reharden in gripping relation to the connectors. A bar can separate gripping portions of the connectors to align them and give them a pre-set position to receive the edge of the printed circuit board easily.

10 Claims, 12 Drawing Figures

APPARATUS FOR HANDLING CONNECTORS

This is a division of application Ser. No. 504,233, filed Sept. 9, 1974 now U.S. Pat. No. 3,940,849.

BACKGROUND OF THE INVENTION

1. Field of the Invention

This invention relates to the field of wire form connectors and particularly to a system and apparatus for handling the wire form connectors so that a large number of them may be simultaneously inserted into one printed circuit structure to grip onto the edge of another printed circuit structure and furnish electrical connection between the two printed circuit structures.

2. The Prior Art

This invention relates to the type of electrical connectors described in my U.S. Pat. No. 3,340,440. These connectors may be described as generally U-shaped with a central reverse bend or as being generally M-shaped. Each connector is a single piece of wire with two outer legs that extend generally parallel to each other in one direction and are joind together by a curved bight section. Instead of a single curved section, the bight has a reverse bend in it so that the overall connector takes generally the shape of an M. The reverse-bent central section is defined by parts of the wire that extend generally in the same direction as the outer ends but the spacing between these two parts of the reverse bend is not uniform. It is smaller at the entrance of the reverse bend to form gripping portions, or jaws, capable of gripping the edge of a printed circuit board or the like. The extent of insertion of the printed circuit board between the two spaced apart gripping portions is limited by the length of the reverse-bent portion. The closed end of the reverse-bent portion may be relatively circularly curved or it may be more nearly straight with sharp curves joining the parts that form the gripping members. In the latter case, there is a more definite location of the edge of a printed circuit board or the like inserted between the gripping portions.

Such connectors have been inserted into printed circuit boards and the like by drilling or forming holes in the printed circuit board in the proper position to receive a second printed circuit board. Normally, the holes are formed in pairs to receive each of the free ends of each connector and the pairs of holes are arranged in two parallel straight lines since the printed circuit board to be inserted between the gripping portions of the aligned connectors is normally straight.

One of the disadvantages of using such connectors is the necessity of inserting each of them separately. In some cases they may be inserted by a machine, but often it is just as economical to insert them individually by hand. The structure into which they are inserted includes metallized areas around each of the holes so that each of the ends of the connectors can be soldered thereto. This is usually done by placing the entire structure over a soldering vessel and causing a wave of solder to wash across the metallized areas and the ends of the connectors. It is preferable to provide means to hold the gripping portions in alignment so that they will remain aligned after the soldering operation has been completed.

It is one of the objects of the present invention to provide a method and apparatus for handling the connectors in groups so that they need not all be inserted separately into holes in a printed circuit board or the like.

It is another object to provide for pre-setting the gripping portions of the connectors so that they will apply a certain pressure to a printed circuit member or the like in use.

It is still another object of the present invention to provide inherent correct alignment of a number of such connectors prior to the time they are inserted into the printed circuit board in which they are to be soldered.

A still further object is to provide an improved holding structure to receive connectors of the aforementiond type.

Another object is to provide for easy removal of a holder after it has served its purpose in facilitating attachment of a group of connectors to a printed circuit board.

Still further objects will become apparent to those skilled in the art after studying the following specification and drawings.

SUMMARY OF THE INVENTION

In accordance with this invention a unitary article is formed of a plurality of connectors, which are of a type shown and described in U.S. Pat. No. 3,340,440, and a holder that grips the connectors in a predetermined aligned array. The holder has a pair of side walls that extend the full length of the array of connectors and at least a short distance beyond each end of the array. The free ends of all of the connectors extend beyond one of the long edges of the side walls so that they can be inserted in correspondingly aligned holes in a printed circuit member, commonly referred to as a mother board, and supported by the holder while being soldered in place.

The side walls of the holder are joined together by a transverse structure that may be a third wall joining the other long edge to form a structure of U-shaped cross-section or may be a plurality of transverse walls. The inwardly facing surfaces of the side walls have parallel grooves to hold the connectors in proper alignment and each groove in one side wall is directly opposite a groove in the other side wall so that the legs of each connector can be held in a pair of opposed grooves. The holder may be made of any suitable material, such as a thermoplastic material molded into the proper shape and having molded grooves to receive the connectors or, in the case of a holder having a U-shaped cross-section, extruded.

If the holder is extruded, the grooves, which are perpendicular to the direction of extrusion, are formed in situ. The method for forming the grooves with the connectors positioned therein requires that the array of connectors first be assembled by having their free ends inserted in properly aligned pairs of holes in a jig which is either in the form of a heat-conductive block or in the form of a plurality of heat-conductive blocks held in rigid, spaced relationship to each other to compensate for heat expansion of the blocks. The assembly of connectors and jig is then heated, for example, in an oven, to bring the legs of the connectors to a high enough temperature to soften the contiguous surface areas of the holder as the latter is pressed upon the assembled connectors in a direction parallel to the legs. The block and connectors are then allowed to cool enough so that the softened regions of the holder reharden in precisly fitting relationship to grip at least a portion of each leg of each connector.

Prior to placing the holder over the connectors, an alignment bar can be forced into the reverse-bent section of the M-shaped connectors. The bar not only aligns the connectors but spaces the gripping portions a certain distance apart. The rehardened holder side walls will retain the sides of the connectors to keep the gripping portions separated further than they would normally be and thus pre-set the connectors to have a certain gripping force on the edge of a printed circuit board of a certain thickness. After the holder and connectors have been joined together and cooled, the alignment bar is removed, and the holder-and-connector assembly is removed from the jig.

When the connectors are to be inserted in previously formed holes in a printed circuit board or the like, the holder may be placed in position to allow the ends of the legs of the connectors to fit into the holes on the printed circuit board and all of the legs sealed in place preferably by a wave of molten solder. The holder may be removed immediately after the soldering operation due to the fact that the molten solder provides enough heat to loosen the thermoplastic material. Alternatively, the holder may be left in place until the holder has cooled and may later be removed by applying sufficient heat, for example by radiant lamp or a heat gun or the like, to soften the thermoplastic holder. Only a relatively low degree of heat need be applied to loosen the holder for removal. The connectors are then fixed in place on the printed circuit board and are ready to receive between their gripping portions another printed circuit or the like. Because the alignment bar may be chosen to have an exact thickness, the distance between the gripping portions of the connectors may be fixed so that they will receive a printed circuit board and apply a certain pressure thereto. In this way a relatively large number of connectors can be placed so as to receive a single printed circuit board and yet the total force exerted by the connectors on the edge of the printed circuit board can be held to an amount that permits the board to be relatively easily inserted and removed, contrary to connectors built into a support structure and not available for easily setting the resilient bias of their gripping portions.

If a larger number of connectors is to be aligned and held by a single holder, means must be provided so that the spacing between them does not change as the jig with the array of connectors on it is allowed to cool. If there is excessive contractions of the jig during cooling, the holder will warp. The use of a material such as Invar, which has a low thermal coefficient of expansion, for the jig eliminates any problem due to shrinkage, but Invar is expensive and difficult to machine, and a substitute is desired. One such substitute is to make the jig of an easily machined material, such as brass and divide the jig into several relatively short segments joined together by a rod of a lower coefficient of expansion, such as steel. The rod and jig segments are gripped at certain points so that expansion in the segments takes place in both directions parallel to the axis of the rod and can thus be divided relatively equally in the two directions. This minimizes the total expansion of the support member, which minimizes the shift in spacing between the connectors as they cool down.

DETAILED DESCRIPTION OF THE INVENTION

Figure 1:
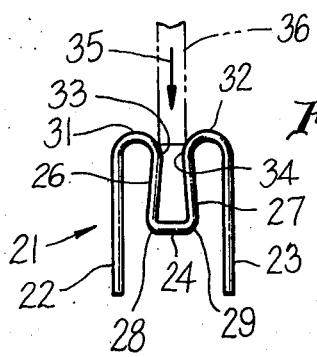
FIG. 1 is a plan view of a connector of the type to be handled by the method and apparatus of the present invention.

The connector shown in FIG. 1 is a wire member 21 that has two substantially parallel legs 22 and 23 joined together at one end and free at the other end. The end at which they are joined together may be referred to as the bight end of the connector but instead of being a simple U-shaped bight, it has a reverse-bent, or downwardly bent section, so that it is more accurately described as M-shaped. The reverse bent section includes a center portion 24 and two sides 26 and 27 joined to the center 24 by relatively sharp bends 28 and 29. The sides 26 and 27 are joined by smoothly curved sections 31 and 32 to the outer legs 22 and 23, respectively.

As will be noted, the outer legs 22 and 23 are longer than the sides 26 and 27, and the sides are closer together at the end where they join the sections 31 and 32, than where they join the center 24. As stated in my U.S. Pat. No. 3,340,440, this structure provides gripping portions 33 and 34 that are rounded to press firmly against the opposite sides of a printed circuit board 36 illustrated in broken lines and shown with an arrow 35 indicating the direction that it is inserted between the gripping portions 33 and 34.

Figure 2:
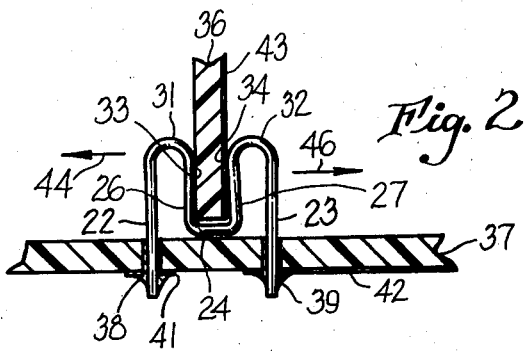
FIG. 2 shows the connector of FIG. 1 installed on a printed circuit board and making connection with a second printed circuit board.

FIG. 2 shows the ends of the legs 22 and 23 inserted through a printed circuit board 37 and attached by solder connections 38 and 39 to metallized sections 41 and 42, respectively. The printed circuit board 37 is defined as a mother board since other boards, such as the board 36, are connected to it and supported by it. The board 36 has a conductive section 43 on one surface to be contacted by the gripping portion 34 as the board 36 is gripped between the portions 33 and 34. As will be noted, the effect of inserting the board 36, which is somewhat thicker than the normal distance between the gripping portions 33 and 34, between the sides 26 and 27 is to force the sides apart slightly in the directions indicated by the arrows 44 and 46. This causes the legs 22 and 23 to be slightly deflected to apply further resilient pressure on the gripping portions 33 and 34 in addition to the pressure provided by the natural resilience that causes the sides 26 and 27 to return to the position occupied in FIG. 1.

Normally a printed circuit board, such as the mother board 37, would have a large number of aligned connectors 21 to grip individual conductive sections of another board such as the board 36. In accordance with the present invention, such connectors 21 are shown mounted in a jig in the form of a heat conductive block, or support member, 47 in FIG. 3. The block 47 may be made of any suitable material, such as brass or steel or, preferably, a material that has a low thermal coefficient of expansion, such as Invar. This block has, in the embodiment shown, two rows of holes 48 bored in it and arranged along two straight parallel lines spaced approximately the same distance apart as the legs 22 and 23 of the connectors 21. The holes 48 need not extend entirely through the block 47, provided they extend far enough to allow the center 24 of each of the connectors 21 to rest on the surface of the block. Furthermore, the holes 48 are slightly oversized and may be slightly countersunk to allow the ends of the legs 22 and 23 of the connectors 21 to be inserted easily. A U-shaped member 50 that is a little taller than the connectors may be placed in the array of connectors nearer one end of the array than the other to fit into a corresponding slot in the board 36 to keep the board 36 from being inserted into the array backward.

One of the important advantages of the connectors 21 is that they may be adjusted to provide a desired pressure by the gripping portions 33 and 34. In order to do this, it is desirable that a bar 49 be placed in the reverse-bent sections of all of the connectors 21 in the block 47. As indicated by the arrow 51, the bar 49 is pressed downwardly between the portions 26 and 27 of all of the connectors 21, except it must be inserted before member 50 is in place. The thickness T of the bar is chosen to space the gripping portions 33 and 34 apart by a certain distance so that, when the connectors 21, which are thus given an initial resilient bias, are placed in the printed circuit board 37 shown in FIG. 2, they will all not only be aligned with each other to receive the printed circuit board 36 easily, but will all press upon the printed circuit board 36 with a certain pressure that is great enough to make good contact between the gripping portion 34 and the conductive layer 43 but is not so great as to make it excessively difficult to push the printed circuit board 36 into gripping engagement with the connectors 21 or to remove it from the connectors. Forcing the bar 49 between the gripping portions 33 and 34 causes the legs 22 and 23 to pivot so that they point toward a common location instead of being parallel. The thicker the bar the greater the deflection of the legs. The actual deflection is small, and the slightly oversized holes in the printed circuit board 37 in FIG. 2 allow the legs 22 and 23 to enter at an angle. The solder connections 38 and 39 keep the legs 22 and 23 tilted at a slight angle, thus retaining a certain spacing between the gripping portions 33 and 34.

Figure 3:
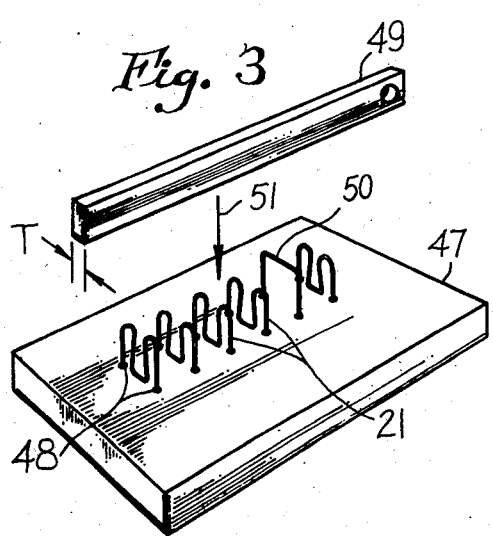
FIG. 3 shows an array of connectors of the type shown in FIG. 1 placed in a support member to be assembled with a holder.

After the bar 49 has been placed in position so that it rest within the reverse-bent part of each of the connectors 21 in FIG. 3, the assembly of the block 47 and connectors 21 and, if used, the block 47 is heated, for example by placing the assembly in an oven.

Figure 4:
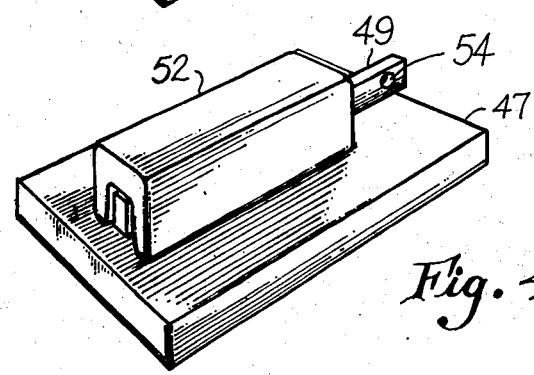
FIG. 4 shows the support member of FIG. 3 with a holder placed over the connectors.

When the assembly reaches a certain temperature, it is removed from the oven, and a suitable holder 52 shown in FIG. 4 is placed over the heated connectors 21 on the block 47. The holder 52 is preferably a thermoplastic material that is relatively hard such as, for example, a hard grade of pure vinyl chloride of approximately 90 durometer. The holder 52 is generally U-shaped and its central channel 53 has side walls that press against the outer legs 22 and 23 of each of the connectors 21 and of the member 50, which is not so tall that it will not fit in the channel 53. The temperature of the heated connectors 21 and member 50 is hot enough to cause the contiguous surfaces of the holder 52 to soften so that the outer legs 22 and 23 of each of the connectors 21 and the member 50 press into the holder to achieve an interfitting relationship. In so doing, at least a portion of the surfaces of the channel 53 that touch each of the legs 22 and 23 of each of the connectors 21 melts slightly to grip the portion of the respective leg pressing against it. The temperature to which a hard grade of pure vinyl chloride should be heated for this purpose is about 300° F to 350° F. The bar 49 is still in place to establish the proper spacing between the gripping portions 33 and 34.

The assembly shown in FIG. 4 is then allowed to cool, after which the bar 49 may then be drawn out by means of a hook (not shown) inserted in a hole 54 at the end of the bar. Then the holder 52 may be lifted free of the block 47 with all of the connectors 21 firmly gripped by the holder. The holder 52 with the connectors 21 firmly embedded in it is then ready for use, as will be described hereinafter.

One of the disadvantages of using a material such as brass for the block 47 is that it has a high coefficient of thermal expansion. As a result, if a large number of connectors 21 is to be held in place by a brass block to allow a long holder 52, for example a holder approximately 3 inches long, to be placed over them, the brass block 47 is likely to contract so much in cooling that the connectors 21 at the ends of the row will be slightly tilted toward each other and the entire holder 52 is likely to acquire a bowed shape. This is not suitable for holding the connectors 21 for insertion in a printed circuit board. Accordingly, the structure shown in FIG. 5 may be used in place of the single block 47 shown in FIGS. 3 and 4.

Figure 5:
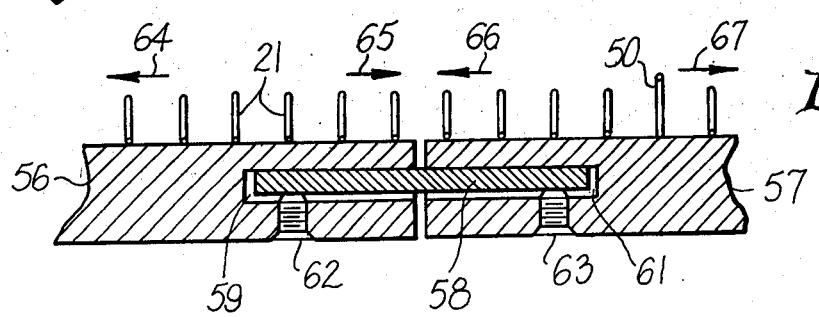
FIG. 5 is a cross-sectional view of a modified form of support member with a large number of connectors mounted on it.

The structure in FIG. 5 includes two blocks 56 and 57 which have a relatively high thermal conductivity, such as brass, but which may also have a relatively high coefficient of thermal expansion. These blocks 56 and 57 are attached to a rod 58 that extends into openings 59 and 61 bored into or otherwise formed in the blocks 56 and 57. The rod 58 is rigidly joined to the blocks 56 and 57 by means of set screws 62 and 63. By making the rod 58 of material that has substantially less thermal coefficient of expansion that the blocks 56 and 57, and by making the point of attachment between the rod and the blocks at a middle section of the blocks, the thermal expansion of each of the blocks 56 and 57 extends away from the point of attachment, i.e. the set screws 62 and 63, in the directions indicated by arrows 64–67. In this way a relatively large number of connectors 21, which are here shown cut along their respective center lines, may be mounted so that the relative shift of position between them is held to a sufficiently low value so that a holder, such as the holder 52 in FIG. 4, having a length of 3½ inches can be placed over them without being forced into a curved shape as the blocks 56 and 57 cool.

Figure 6:
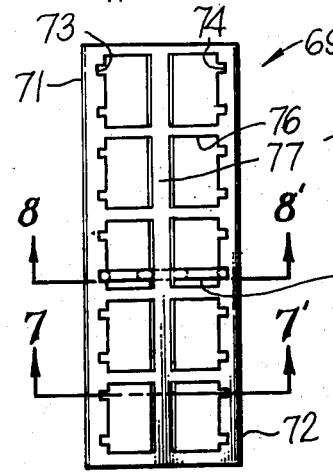
FIG. 6 is a plan view of a modified form of holder.
Figure 7:
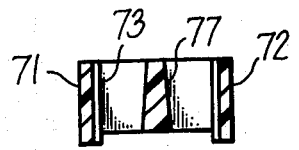
FIG. 7 is a cross-sectional view of the holder in FIG. 6 along the line 7–7'.
Figure 8:
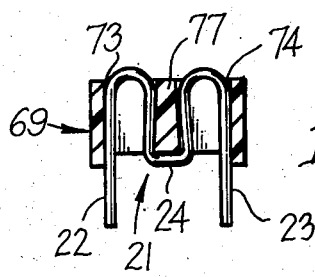
FIG. 8 shows a connector in a different cross-sectional location of the holder in FIG. 6 along the line 8–8'.

FIGS. 6–8 show a modified form of holder 69 that has a pair of side walls 71 and 72, each of which has a plurality of grooves 73 and 74, respectively, formed in it. Each of these grooves has a depth approximately equal to the diameter of the wire from which the connectors 21 are made and a width slightly greater than that diameter to accomodate a slight amount of warping of the connectors out of their normal form in which all parts of a connector lie in one plane. For strength, the holder 69 has a plurality of transverse walls 76 between the side walls 71 and 72. The holder 69 also has a built-in central bar 77 that has a slightly tapered cross-section as shown in FIGS. 7 and 8.

FIG. 8 shows a connector 21 placed in the holder 69 and pressed upwardly far enough so that its center 24 is against the upper edge of the bar 77. Its outer legs 22 and 23 fit into the grooves 73 and 74, respectively, to be held firmly. The bottom surfaces of the grooves are slanted slightly inwardly to hold the connectors 21 more firmly, and the central bar 77 cooperates with grooves to provide accurate alignment of the connectors.

Figure 9:
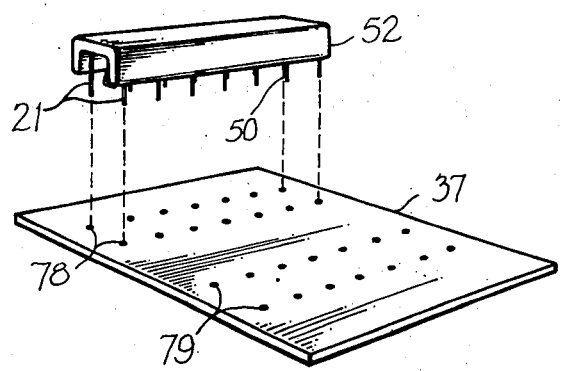
FIG. 9 shows a holder with connectors in it aligned to place the connectors in a printed circuit board.

FIG. 9 shows the holder 52 with the connectors 21 and the member 50 in it aligned over a double row of holes 78 in the printed circuit mother board 37. The board is also shown as having a second set of holes 79 to receive a second set of connectors 21. The metallized area around each hole does not appear on the surface of the board 37 shown in FIG. 9.

Figure 10:
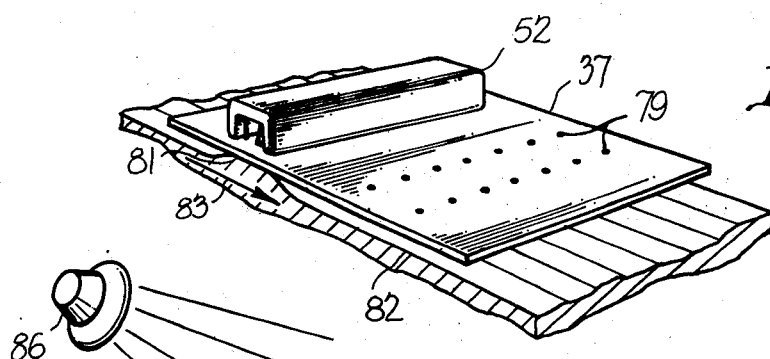
FIG. 10 shows the holder and printed circuit board of FIG. 9 and diagrammatically illustrates a wave-soldering bath under the printed circuit board.

FIG. 10 shows the board 37 after the holder 52 has been lowered to allow the ends of the connectors 21 and the member 50 to extend through the holes 78. A wave 81 of molten solder 82 is shown sweeping the lower surface of the board 37 in the direction of an arrow 83 to solder each connector 21 and the member 52 in place.

Figure 11:
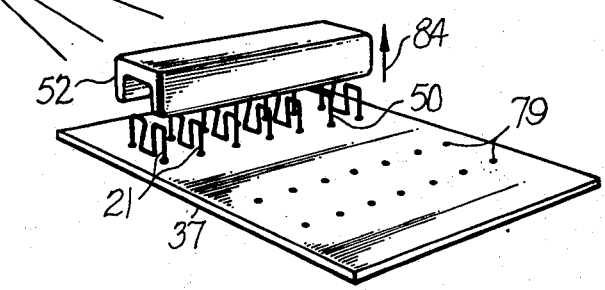
FIG. 11 shows the holder of FIG. 10 being removed from the connectors mounted on the printed circuit board.

FIG. 11 shows the holder 52 moving up in the direction of an arrow 84 after having been heated by a source 86, which may be an infra-red lamp or a heat gun or another source. The holder could have been removed when the connectors 21 and the member 50 were heated by the solder, but to do so might cause a small shift in the location of any connectors embedded in solder that was still soft. It is better to be sure that the solder has hardened and then reheat with the source 86.

Figure 12:
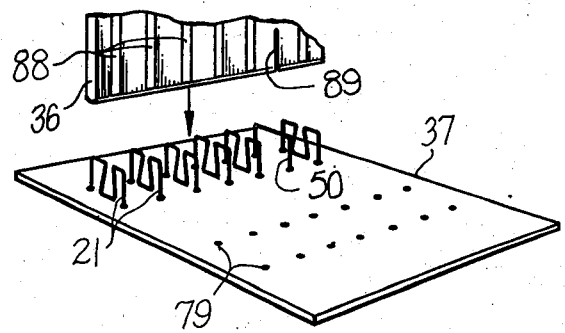
FIG. 12 shows a second printed circuit board being inserted into the connectors on the first printed circuit board.

FIG. 12 shows the completely installed connectors 21 and the member 50 about to receive the printed circuit board 36 as it moves in the direction of the arrow 87. The board 36 has a printed conductive strip 88 to be mechanically grasped and electrically connected by each of the connectors 21. It also has a slot 89 that fits over the upper bar of the member 50 to prevent the board 36 from being installed backward.

While the invention has been described in terms of specific embodiments and steps, it will be understood that modifications may be made therein within the scope of the following claims.

What is claimed is:

1. An article of manufacture comprising a plurality of resilient wire connector members, each formed of an integral piece of wire bent to comprise a pair of legs extending generally parallel to each other and an integral, reverse-bent part joining said legs together at one end thereof, the other end of each of said legs being free; and a holder for a plurality of said wire members and comprising: a body portion comprising a pair of substantially parallel side walls having surfaces facing toward each other, each of said walls having parallel grooves in the facing surface thereof aligned with corresponding ones of said grooves in the facing surface of the other of said walls to comprise an aligned pair of grooves, said walls being spaced apart by a distance slightly less than the normal distance across said pair of legs to the outermost part of the surfaces of said legs, each of said wire members being firmly but releasably held by the inner surfaces of one of said aligned pairs of grooves pressing in opposite directions on said legs of the respective wire member, said holder further comprising means between said side walls and parallel thereto to engage the reverse-bent part of said wire members and provide alignment of the relative positions of all of said wire members in the direction perpendicular to the longitudinal direction of said grooves.

2. The article of claim 1 in which said holder is generally U-shaped and encloses all but the free ends of the legs of said wire members.

3. The article of claim 2 in which said holder is a thermoplastic material and each of said grooves is formed in situ in juxtaposed sections of the inwardly-facing wall of said U-shaped holder to conform to the configuration of a contiguous portion of a respective one of said legs.

4. The article of claim 3 in which said wire members are generally M-shaped and said reverse-bent part comprises a central loop extending in the same direction as the legs thereof and defined by opposite sides and a bight, each of said legs being joined respectively to one side of said loop by additional curved sections of said wire, portions of the opposite sides of said loop closer to their respective juncture with respective legs being spaced closer together than other portions of the opposite sides of said loop closer to the bight, said closer-spaced portions defining gripping portions to receive and to grip secondary members of predetermined thickness, said wall of said holder comprising means to hold each of said wire members with a predetermined spacing between its gripping portions to provide a predetermined gripping pressure therebetween.

5. The article of claim 4 in which at least one of said wire members is generally U-shaped and has legs longer than the M-shaped wire members so that the bight portion of said U-shaped wire member extends more deeply into the bight region of said U-shaped holder than do said gripping portions of said M-shaped wire members.

6. The article of claim 1 in which said grooves have bottom surfaces slightly slanted toward each other to press the free ends of said legs slightly toward each other.

7. The article of claim 1 in which said holder comprises a plurality of transverse walls extending perpendicularly between said side walls.

8. The article of claim 7 in which said means between said side walls comprises a central wall parallel to said side walls, said wire members being generally M-shaped and comprising a central loop extending in the same direction as the legs thereof, each of said legs being joined to a respective side of said loop by additional curved sections of said wire, portions of the sides of said loop being spaced closer together toward their respective junctures with the respective legs than toward the bight portion of said loop to define gripping portions to receive and to grip secondary members, said central wall fitting into said central loop to stabilize the positions of said members in said holder.

9. The article of claim 8 in which each of said grooves has juxtaposed sidewalls spaced apart a distance slightly greater than the diameter of said wire members and a depth substantially equal to the diameter of said wire members.

10. The article of claim 8 in which said central wall has a tapered cross-section corresponding generally to the variation in distance between said side of said loop from said gripping portions to said bight portion thereof.

* * * * *